(12) United States Patent
Suwankasab et al.

(10) Patent No.: US 9,721,877 B1
(45) Date of Patent: Aug. 1, 2017

(54) METHOD OF MOUNTING PASSIVE ELECTRONIC COMPONENT ON LEAD FRAME

(71) Applicant: Nexperia B.V., Eindhoven (NL)

(72) Inventors: Chanon Suwankasab, Bangkok (TH); Amornthep Saiyajitara, Bangkok (TH); Surachai Tangsiriratchatakun, Bangkok (TH); Chayathorn Saklang, Bangkok (TH)

(73) Assignee: Nexperia B.V., Eindhoven (NL)

( * ) Notice: Subject to any disclaimer, the term of this patent is extended or adjusted under 35 U.S.C. 154(b) by 0 days.

(21) Appl. No.: 15/371,219

(22) Filed: Dec. 7, 2016

(51) Int. Cl.
*H05K 1/18* (2006.01)
*H05K 3/30* (2006.01)
*H01L 23/495* (2006.01)
*H01L 21/48* (2006.01)
*H01G 2/02* (2006.01)

(52) U.S. Cl.
CPC ......... *H01L 23/49589* (2013.01); *H01G 2/02* (2013.01); *H01L 21/4825* (2013.01); *H01L 23/49513* (2013.01); *H01L 23/49541* (2013.01); *H05K 1/183* (2013.01); *H05K 3/303* (2013.01); *H05K 3/305* (2013.01)

(58) Field of Classification Search
CPC ........ H05K 1/181; H05K 1/182; H05K 1/183; H05K 3/303; H05K 3/305
See application file for complete search history.

(56) References Cited

U.S. PATENT DOCUMENTS

| 5,367,124 | A  | 11/1994 | Hoffman et al. |
| 5,804,880 | A  | 9/1998  | Mathew |
| 6,329,706 | B1 | 12/2001 | Nam |
| 6,351,033 | B1 | 2/2002  | Lotfi et al. |

*Primary Examiner* — Jeremy C Norris
(74) *Attorney, Agent, or Firm* — Ohlandt, Greeley, Ruggiero & Perle, L.L.P.

(57) ABSTRACT

A packaged electronic device has first and second lead frame leads and a passive electronic component mounted, across a gap between the leads, on the top sides of the leads, using an adhesive. Facing lateral sides of the leads each include a recess that receives the adhesive. The recess promotes adhesion between the electronic component and the corresponding lead while limiting spread of the adhesive on the bottom side of the electronic component. The adhesive in the recesses promotes adhesion of the component to the leads by inhibiting cracking, and enhances inspection capability at the device backside.

21 Claims, 6 Drawing Sheets

METHOD OF MOUNTING PASSIVE ELECTRONIC COMPONENT ON LEAD FRAME

BACKGROUND

The invention relates to packaged electronic devices and, more particularly, to a lead frame and a method of mounting passive electronic components on the lead frame.

In the field of packaged electronic devices, it is known to mount an electronic component, such as a capacitor, onto two adjacent leads of a lead frame such that the capacitor spans the gap between the leads, where one terminal of the capacitor is electrically connected to one lead and the other capacitor terminal is electrically connected to the other lead. When the capacitor is mounted using an adhesive, such as an electrically conductive adhesive, cracking can occur within the adhesive interface between the component and each lead that can jeopardize the electrical connections between the component and the leads as well as the mechanical bonding of the component to the leads.

It would be advantageous to have a method of mounting passive devices to leads of a lead frame that provides for a secure mechanical and electrical connection.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Detailed illustrative embodiments of the invention are disclosed herein. However, specific structural and functional details disclosed herein are merely representative for purposes of describing example embodiments of the invention. The invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the invention is a sub-assembly for a packaged electronic device. The sub-assembly comprises first and second leads of a lead frame and an electronic component. The first lead comprises a top side, a bottom side, and a first lateral side. The second lead is separated from the first lead by a gap and comprises a top side, a bottom side, and a first lateral side. The electronic component comprises a top side, a bottom side, and first and second lateral sides. The electronic component is mounted, across the gap, onto the top sides of the first and second leads using an adhesive.

A first portion of the adhesive is located between the bottom side of the electronic component and the top side of the first lead, a second portion of the adhesive is located between the bottom side of the electronic component and the top side of the second lead, a third portion of the adhesive spans between the bottom side of the electronic component and the first lateral side of the first lead, and a fourth portion of the adhesive spans between the bottom side of the electronic component and the first lateral side of the second lead.

In another embodiment, the invention is a method for assembling a sub-assembly for a packaged electronic device. The method comprises providing a lead frame comprising (i) a first lead comprising a top side, a bottom side, and a first lateral side and (ii) a second lead separated from the first lead by a gap, the second lead comprising a top side, a bottom side, and a first lateral side.

Adhesive is applied to the top sides of the first and second leads, and an electronic component comprising a top side, a bottom side, and first and second lateral sides is applied onto the adhesive. The electronic component is mounted, across the gap, onto the top sides of the first and second leads.

A first portion of the adhesive becomes located between the bottom side of the electronic component and the top side of the first lead, a second portion of the adhesive becomes located between the bottom side of the electronic component and the top side of the second lead, a third portion of the adhesive spans between the bottom side of the electronic component and the first lateral side of the first lead, and a fourth portion of the adhesive spans between the bottom side of the electronic component and the first lateral side of the second lead.

Figure 1A:
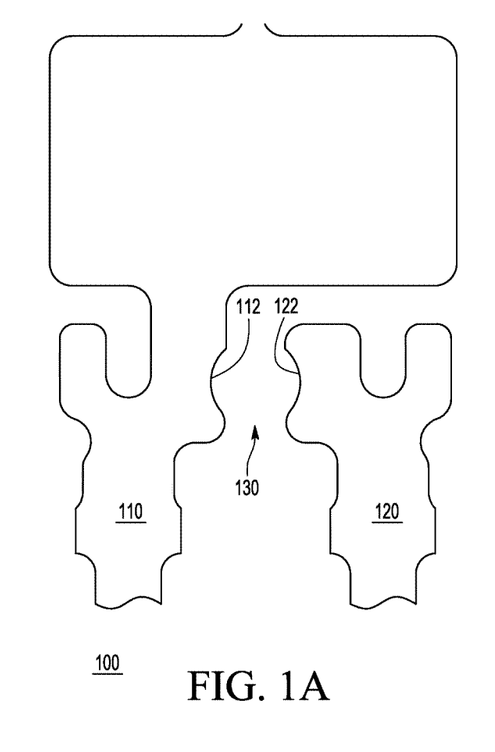
FIG. 1A is a top plan view of a portion of a lead frame used to assemble a packaged electronic device (not shown), according to one embodiment of the invention.
Figure 1B:
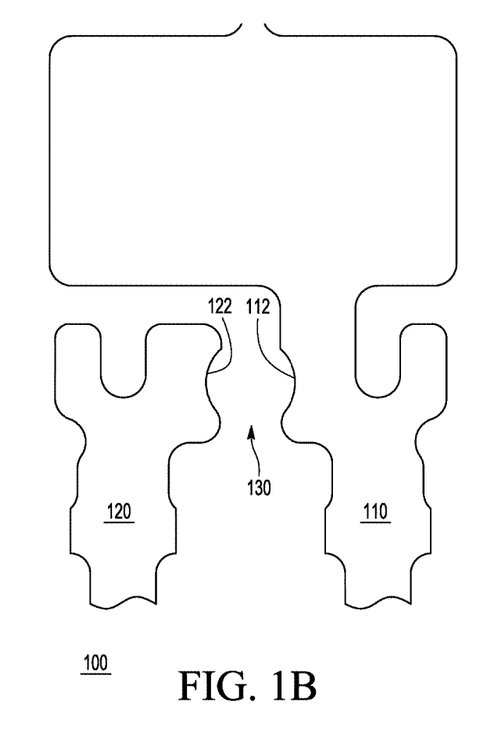
FIG. 1B is a bottom plan view of the portion of the lead frame of FIG. 1A.

Referring not now to FIG. 1A, a top plan view of a portion of a lead frame 100 used to assemble a packaged electronic device (not shown), according to one embodiment of the invention, is shown. FIG. 1B is a bottom plan view of the portion of the lead frame 100 of FIG. 1A. Note that, as used in this specification, the terms "top," "bottom," and "lateral" are relative terms based on a typical orientation of the described structures and do not refer to inherent characteristics of those described structures.

The lead frame 100 has (at least) a first lead 110 and a second lead 120 separated from the first lead 110 by a gap 130. On one lateral side, the shape of the first lead 110 defines a curved recess 112, while, on one lateral side, the shape of the second lead 120 defines another curved recess 122.

Figure 2A:
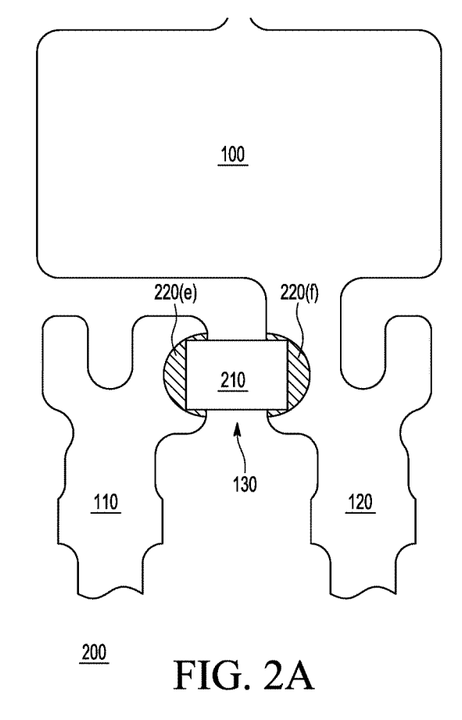
FIG. 2A is a top plan view of a portion of a sub-assembly formed by mounting an electronic component onto the top sides of the two adjacent leads of the lead frame of FIGS. 1A and 1B using a suitable adhesive.
Figure 2B:
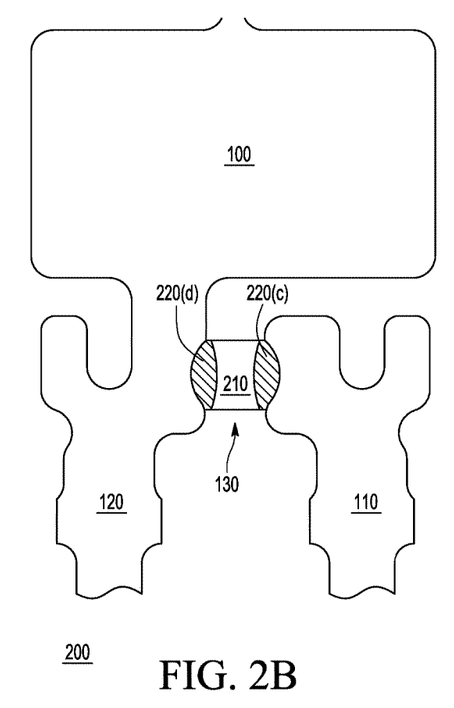
FIG. 2B is a bottom plan view of the portion of the sub-assembly of FIG. 2A.

FIG. 2A is a top plan view of a portion of a sub-assembly 200 formed by mounting an electronic component 210 across the gap 130 onto the top sides of the two adjacent leads 110 and 120 of the lead frame 100 of FIGS. 1A and 1B using a suitable adhesive 220. FIG. 2B is a bottom plan view of the portion of the sub-assembly 200 of FIG. 2A.

The electronic component 210 can be any suitable passive or active electronic component, and, depending on the particular type of component, the adhesive 220 can be either a suitable electrically conductive adhesive or a suitable electrically non-conductive adhesive. In one implementation, the electronic component 210 is a capacitor, and the adhesive 220 is an electrically conductive adhesive that mechanically bonds the capacitor to the top sides of the leads 110 and 120 and electrically connects one terminal of the capacitor to the first lead 110 and the other capacitor terminal to the second lead 120.

Figure 2C:
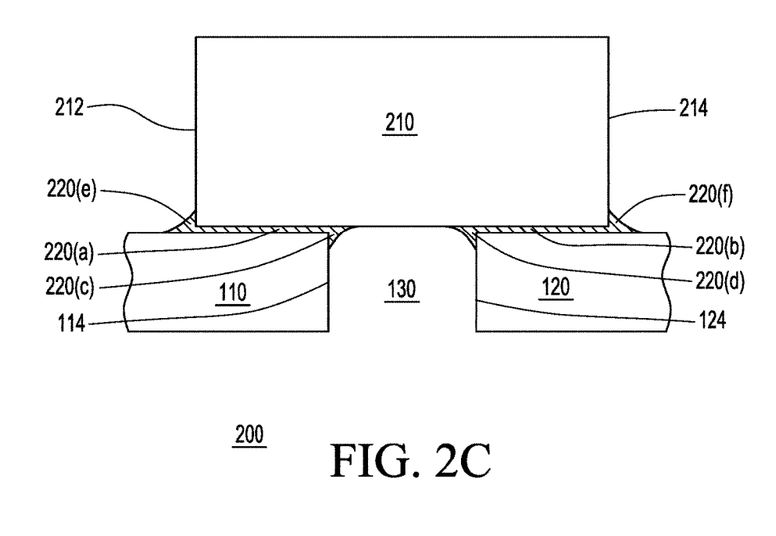
FIG. 2C is a cross-sectional side view of a portion of the sub-assembly of FIGS. 2A and 2B.

FIG. 2C is a cross-section side view of a portion of the sub-assembly 200 of FIGS. 2A and 2B. FIG. 2C shows the electronic component 210 mounted onto the top sides of the first and second leads 110 and 120 using the adhesive 220. FIG. 2C also shows the FIG. 2C also shows the following six different portions 220(a)-220(f) of the adhesive 220. A first portion 220(a) located between the bottom side of the electronic component 210 and the top side of the first lead 110. A second portion 220(b) located between the bottom side of the electronic component 210 and the top side of the second lead 120. A third portion 220(c) that spans between the bottom side of the electronic component 210 and a first lateral side 114 of the first lead 110 that is substantially orthogonal to the bottom side of the electronic component 210. A fourth portion 220(d) that spans between the bottom side of the electronic component 210 and a first lateral side 124 of the second lead 120 that is substantially orthogonal to the bottom side of the electronic component 210. A fifth portion 220(e) that spans between a first lateral side 212 of the electronic component 210 and the top side of the first lead 110, which is substantially orthogonal to the first lateral side 212; and a sixth portion 220(f) that spans between a second lateral side 214 of the electronic component 210 and the top side of the second lead 120, which is substantially orthogonal to the second lateral side 214. The fifth and sixth adhesive portions 220(e) and 220(f) are optional, and therefore one or both might not exist in some embodiments of the invention.

The third and fourth adhesive portions 220(c) and 220(d) strengthen the mechanical bonding between the electronic component 210 and the leads 110 and 120 beyond the mechanical bonding that would be provided by only the first and second adhesive portions 220(a) and 220(b). The third and fourth adhesive portions 220(c) and 220(d) are visible in the bottom plan view of FIG. 2B, that is, visible from below the sub-assembly 200. This visibility enables inspection of the sub-assembly 200 to verify that the third and fourth adhesive portions 220(c) and 220(d) are properly configured.

The fifth and sixth adhesive portions 220(e) and 220(f) further strengthen the mechanical bonding between the electronic component 210 and the leads 110 and 120. Note that the fifth and sixth adhesive portions 220(e) and 220(f) are visible from above the sub-assembly 200. This visibility enables inspection of the sub-assembly 200 to verify that the fifth and sixth adhesive portions 220(e) and 220(f) are properly configured.

In an implementation in which the electronic component 210 is a capacitor having opposing terminals respectively mounted onto the leads 110 and 120 using an electrically conductive adhesive 220, it is important that the third and fourth adhesive portions 220(c) and 220(d) are mechanically and electrically isolated from one another to prevent electrical shorting between the capacitor terminals. The curved shapes of the recesses 112 and 122 on the lateral sides of the leads 110 and 120 shown, for example, in FIGS. 1A and 1B, help to prevent such electrical shorting by providing additional volume for receiving the adhesive 220 that limits the spread of the adhesive 220 on the bottom side of the capacitor 210 to prevent direct contact between the third and fourth adhesive portions 220(c) and 220(d), while still promoting the additional mechanical bonding to the leads 110 and 120 provided by the third and fourth adhesive portions 220(c) and 220(d).

Figure 3:
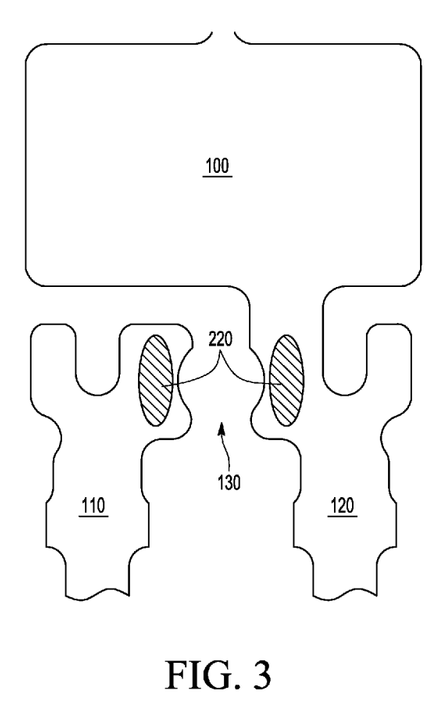
FIG. 3 is a top plan view of the portion of the lead frame of FIGS. 1A and 1B after the adhesive has been applied to the top sides of the first and second leads.
Figure 4:
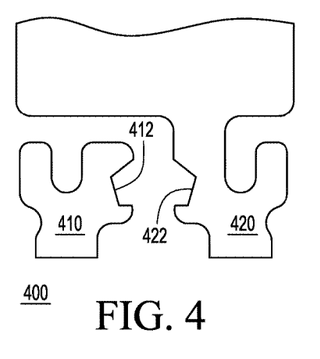
FIGS. 4-10 are top plan views of lead frames according to alternative embodiments of the invention.
Figure 5:
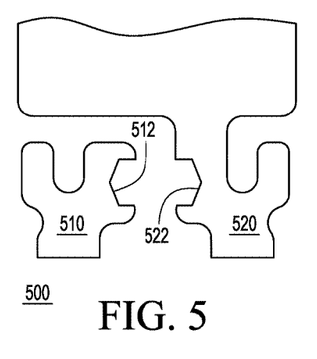
Figure 6:
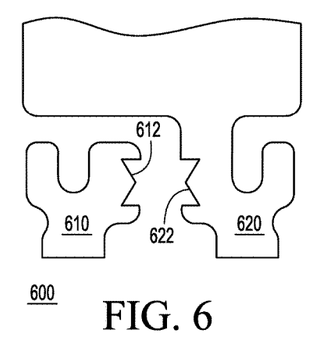
Figure 7:
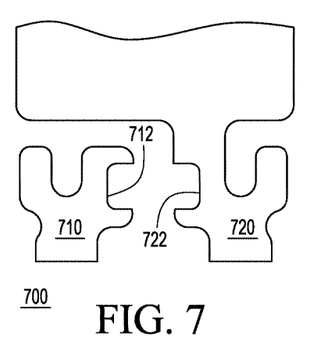
Figure 8:
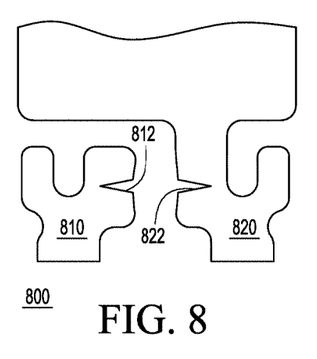
Figure 9:
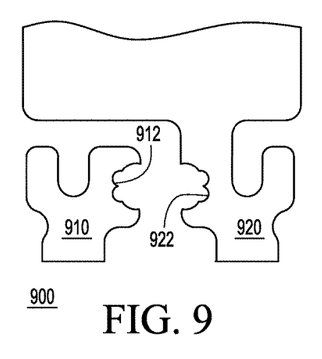
Figure 10:
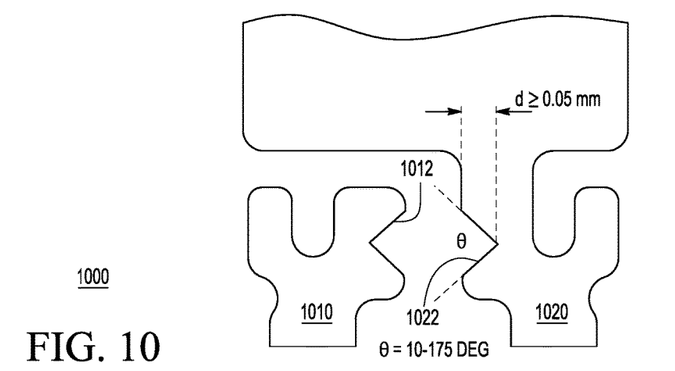

In one embodiment, the process of assembling the sub-assembly 200 of FIGS. 2A-2C begins by applying a desired amount of the uncured adhesive 220 in a viscous liquid or gel form onto the top side of each of the first and second leads 110 and 120 of the lead frame 100 of FIGS. 1A and 1B. FIG. 3 is a top plan view of the portion of the lead frame 100 after the adhesive 220 has been applied to the top sides of the leads 110 and 120.

The next step is to place the electronic device 210 onto the adhesive-covered portions of the first and second leads 110 and 120 and apply a sufficient amount of pressure, during which the uncured adhesive 220 flows to form all six portions 220(a)-220(f) of the adhesive 220 shown in FIG. 2C. Note that each of the portions 220(c)-220(f) corresponds to adhesive meniscus. Depending on the implementation, the adhesive 220 is then cured with the application of heat, radiation, and/or time, to form the sub-assembly 200 of FIGS. 2A-2C with the electronic device 210 securely mounted onto and, if appropriate, electrically connected to the first and second leads 110 and 120.

FIGS. 4-10 are top plan views of lead frames 400-1000 having leads 410-1010 and 420-1020, respectively, according to alternative embodiments of the invention. The leads 410-1010 and 420-1020 define differently shaped recesses 412-1012 and 422-1022 that can be employed to achieve the similar results of good mechanical bonding and short-circuit prevention achieved by the recesses 112 and 122 of the leads 110 and 120 of FIGS. 1A-2C. In general, leads of the invention may have recesses with any suitable shapes.

Figure 11:
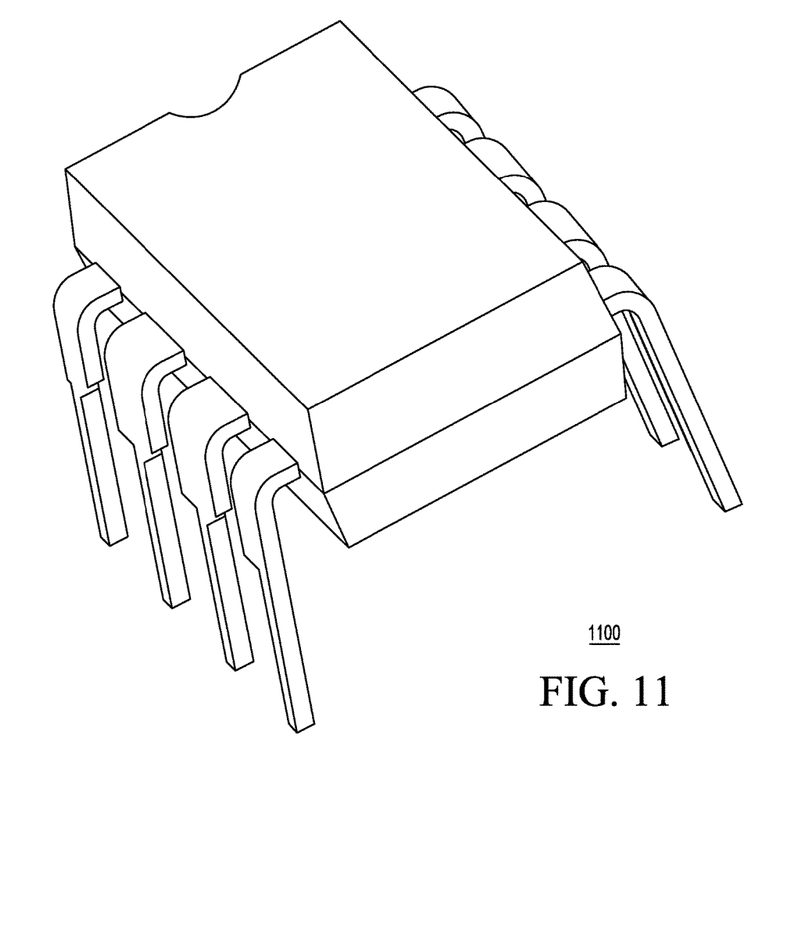
FIG. 11 is an isometric view of an example packaged electronic device according to one embodiment of the invention.

FIG. 11 is a perspective view of an example packaged electronic device 1100, according to one embodiment of the invention. Those skilled in the art will understand that the invention can be implemented in a wide variety of different types of packaged electronic devices.

Those skilled in the art will understand that the lead frames of the invention may be made of any suitable materials, including, but not limited to, copper.

As used in this specification, the term "adhesive" covers epoxies, glues, and other types of adhesives that are applied in a viscous liquid or gel form and then cured. In addition, the term "adhesive" also covers solders and other connecting materials that are re-flowed by the application of heat to form the different adhesive portions 220(a)-220(f) of FIG. 2C.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

A lead frame is a collection of metal leads and possibly other elements (e.g., power bars, die paddles also known as die pads and die flags) that is used in electronic packaging for assembling one or more integrated circuit (IC) dies into a single packaged electronic device. Prior to assembly into a packaged device, a lead frame may have support structures (e.g., a rectangular metal frame and tie bars) that keep those elements in place. During the assembly process, the support structures may be removed. As used herein, the term "lead frame" may be used to refer to the collection of elements before assembly or after assembly, regardless of the presence or absence of those support structures.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. A sub-assembly for a packaged electronic device, the sub-assembly comprising:
   a first lead of a lead frame, the first lead comprising a top side, a bottom side, and a first lateral side;
   a second lead of the lead frame separated from the first lead by a gap, the second lead comprising a top side, a bottom side, and a first lateral side; and
   an electronic component comprising a top side, a bottom side, and first and second lateral sides, wherein the electronic component is mounted, across the gap, onto the top sides of the first and second leads using an adhesive,
   wherein each first lateral side of the first and second leads defines a recess that receives the adhesive to promote adhesion between the electronic component and the corresponding lead while limiting spread of the adhesive on the bottom side of the electronic component.

2. The sub-assembly of claim 1, wherein:
   a first portion of the adhesive is located between the bottom side of the electronic component and the top side of the first lead;
   a second portion of the adhesive is located between the bottom side of the electronic component and the top side of the second lead;
   a third portion of the adhesive spans between the bottom side of the electronic component and the first lateral side of the first lead; and
   a fourth portion of the adhesive spans between the bottom side of the electronic component and the first lateral side of the second lead.

3. The sub-assembly of claim 2, wherein the third and fourth portions of the adhesive correspond to adhesive meniscus.

4. The sub-assembly of claim 2, wherein the third and fourth portions of the adhesive are visible from below the sub-assembly.

5. The sub-assembly of claim 2, wherein:
   a fifth portion of the adhesive spans between the first lateral side of the electronic component and the top side of the first lead; and
   a sixth portion of the adhesive spans between the second lateral side of the electronic component and the top side of the second lead.

6. The sub-assembly of claim 5, wherein the fifth and sixth portions of the adhesive correspond to adhesive meniscus.

7. The sub-assembly of claim 5, wherein the fifth and sixth portions of the adhesive are visible from above the sub-assembly.

8. The sub-assembly of claim 1, wherein the electronic component comprises a passive electronic device.

9. The sub-assembly of claim 1, wherein the adhesive comprises epoxy.

10. The sub-assembly of claim 1, wherein the adhesive comprises solder.

11. The packaged electronic device of claim 1.

12. The lead frame of claim 1.

13. A method for assembling a sub-assembly for a packaged electronic device, the method comprising:
   providing a lead frame comprising (i) a first lead comprising a top side, a bottom side, and a first lateral side and (ii) a second lead separated from the first lead by a gap, the second lead comprising a top side, a bottom side, and a first lateral side;
   applying adhesive to the top sides of the first and second leads; and
   applying an electronic component comprising a top side, a bottom side, and first and second lateral sides onto the adhesive, wherein the electronic component is mounted, across the gap, onto the top sides of the first and second leads
   wherein each first lateral side of each of the first and second leads defines a recess that receives the adhesive to promote adhesion between the electronic component and the corresponding lead while limiting spreading of the adhesive on the bottom side of the electronic component.

14. The method of claim 13, wherein:
a first portion of the adhesive becomes located between the bottom side of the electronic component and the top side of the first lead;
a second portion of the adhesive becomes located between the bottom side of the electronic component and the top side of the second lead;
a third portion of the adhesive spans between the bottom side of the electronic component and the first lateral side of the first lead; and
a fourth portion of the adhesive spans between the bottom side of the electronic component and the first lateral side of the second lead.

15. The method of claim 13, wherein the third and fourth portions of the adhesive correspond to adhesive meniscus.

16. The method of claim 13, further comprising viewing the sub-assembly from below to verify existence of the third and fourth portions of the adhesive.

17. The method of claim 13, wherein:
a fifth portion of the adhesive spans between the first lateral side of the electronic component and the top side of the first lead; and
a sixth portion of the adhesive spans between the second lateral side of the electronic component and the top side of the second lead.

18. The method of claim 17, wherein the fifth and sixth portions of the adhesive correspond to adhesive meniscus.

19. The method of claim 17, further comprising viewing the sub-assembly from above to verify existence of the fifth and sixth portions of the adhesive.

20. The method of claim 13, wherein the electronic component comprises a passive electronic device.

21. A packaged electronic device assembled using the method of claim 13.

* * * * *